(12) United States Patent
Fu et al.

(10) Patent No.: US 9,894,779 B2
(45) Date of Patent: Feb. 13, 2018

(54) EMBEDDED COMPONENT SUBSTRATE AND METHOD FOR FABRICATING THE SAME

(71) Applicant: NAN YA PCB Corporation, Taoyuan (TW)

(72) Inventors: Wei-Ta Fu, Taoyuan (TW); Kuo-Chang Wu, Yilan County (TW); Yu-Chih Lin, Taoyuan (TW)

(73) Assignee: Nan Ya PCB Corp., Taoyuan County (TW)

( * ) Notice: Subject to any disclaimer, the term of this patent is extended or adjusted under 35 U.S.C. 154(b) by 186 days.

(21) Appl. No.: 14/790,669

(22) Filed: Jul. 2, 2015

(65) Prior Publication Data
US 2016/0007469 A1    Jan. 7, 2016

(30) Foreign Application Priority Data
Jul. 2, 2014 (TW) .............................. 103122800 A

(51) Int. Cl.
*H05K 1/18* (2006.01)
*H05K 3/42* (2006.01)
(Continued)

(52) U.S. Cl.
CPC ........... *H05K 3/4602* (2013.01); *H01L 24/19* (2013.01); *H01L 24/24* (2013.01); *H05K 1/188* (2013.01); *H01L 24/32* (2013.01); *H01L 24/73* (2013.01); *H01L 24/83* (2013.01); *H01L 24/92* (2013.01); *H01L 2224/12105* (2013.01); *H01L 2224/24227* (2013.01); *H01L 2224/32225* (2013.01); *H01L 2224/73267* (2013.01); *H01L 2224/83192* (2013.01); *H01L 2224/92244* (2013.01); *H01L 2924/14* (2013.01); *H01L 2924/15153* (2013.01); *H01L 2924/15311* (2013.01); *H05K 3/427* (2013.01); *H05K 2201/10181* (2013.01); *H05K 2201/10636* (2013.01);
(Continued)

(58) Field of Classification Search
CPC ...... H05K 3/4602; H05K 1/188; H05K 3/427; H05K 1/186
See application file for complete search history.

(56) References Cited

U.S. PATENT DOCUMENTS

| 6,972,964 B2 * | 12/2005 | Ho ...................... H01L 23/5389 257/E23.178 |
| 7,242,591 B2 * | 7/2007 | Imamura ................ H05K 1/186 361/761 |

(Continued)

FOREIGN PATENT DOCUMENTS

TW         20147510 A   *   7/2014

*Primary Examiner* — Nathan Milakovich

(57) ABSTRACT

An embedded component substrate and methods for fabricating the same are provided. The embedded component substrate includes a substrate having at least one cavity, a first surface, and a second surface. The embedded component substrate also includes at least one electronic component formed in the at least one cavity. The embedded component substrate also includes a first wiring layer formed in the space between a sidewall of the at least one electronic component and a sidewall of the at least one cavity. The first wiring layer extends from the first surface of the substrate to the sidewall of the at least one cavity, and directly contacts the at least one electronic component.

14 Claims, 14 Drawing Sheets

(51) Int. Cl.
*H05K 3/46* (2006.01)
*H01L 23/00* (2006.01)

(52) U.S. Cl.
CPC .............. *H05K 2203/072* (2013.01); *H05K 2203/1469* (2013.01); *Y02P 70/611* (2015.11)

(56) References Cited

U.S. PATENT DOCUMENTS

| | | | | |
|---|---|---|---|---|
| 7,282,394 B2* | 10/2007 | Cho | ................ | H01L 24/18 257/E21.509 |
| 7,350,296 B2* | 4/2008 | Ryu | ................ | H05K 1/185 174/260 |
| 7,704,846 B2* | 4/2010 | Cho | ................ | H01L 23/642 257/378 |
| 7,869,222 B2* | 1/2011 | Shih | ................ | H01L 23/5389 361/761 |
| 8,000,107 B2* | 8/2011 | Wang | ................ | H01L 23/5389 174/250 |
| 8,099,865 B2* | 1/2012 | Wang | ................ | H01L 23/5389 174/260 |
| 8,420,954 B2* | 4/2013 | Lin | ................ | H05K 1/0203 174/15.1 |
| 8,942,004 B2* | 1/2015 | Hong | ................ | H05K 1/185 174/262 |
| 9,398,694 B2* | 7/2016 | Merkle | ................ | H05K 1/0243 |
| 2006/0118931 A1* | 6/2006 | Ho | ................ | H01L 23/49822 257/678 |
| 2007/0074900 A1* | 4/2007 | Lee | ................ | H05K 1/185 174/260 |
| 2008/0315398 A1* | 12/2008 | Lo | ................ | H01L 23/3675 257/693 |
| 2012/0042513 A1* | 2/2012 | Kim | ................ | H01L 23/5389 29/832 |
| 2014/0062607 A1* | 3/2014 | Nair | ................ | H01L 25/16 331/68 |
| 2014/0124255 A1* | 5/2014 | Kim | ................ | H05K 3/429 174/260 |
| 2014/0167273 A1* | 6/2014 | Kim | ................ | H01L 21/6836 257/773 |
| 2014/0182892 A1* | 7/2014 | Hsu | ................ | H05K 1/186 174/251 |
| 2015/0319863 A1* | 11/2015 | Turpuseema | ................ | H05K 3/0026 361/761 |

\* cited by examiner

EMBEDDED COMPONENT SUBSTRATE AND METHOD FOR FABRICATING THE SAME

CROSS REFERENCE TO RELATED APPLICATIONS

This Application claims priority of Taiwan Patent Application No. 103122800, filed on Jul. 2, 2014, the entirety of which is incorporated by reference herein.

BACKGROUND

Field of the Disclosure

The present disclosure relates to a semiconductor device, and in particular, it relates to an embedded component substrate and method for fabricating the same.

Description of the Related Art

In the new generation of electronic products, the development of lighter, thinner, shorter, and smaller electronic products is continuously being pursued, and multi-functional, high-performance electronic products are also required. Therefore, in order to meet the requirements of high density and miniaturization, integrated circuits (IC) have to accommodate more electronic components in a limited space.

Thus, a novel packaging technology has been developed to embed electronic components in the substrate to significantly reduce the package size and shorten the transmission path between the embedded electronic component and the chip. In recent years, the technology behind the embedded component substrate has been developed. The technology of the embedded component substrate can improve the performance of electronic components, reduce the substrate area occupied by the electronic components, and significantly reduce the overall volume of the package structure.

However, in order to meet the requirements of high-density wiring, the technology of the embedded component substrate still faces a lot of challenges.

BRIEF SUMMARY

The disclosure provides an embedded component substrate. The embedded component substrate includes a substrate having at least one cavity, a first surface and a second surface. The embedded component substrate also includes at least one electronic component formed in the at least one cavity. The embedded component substrate also includes a first wiring layer formed in the space between a sidewall of the at least one electronic component and a sidewall of the at least one cavity. The first wiring layer extends from the first surface of the substrate to the sidewall of the at least one cavity, and directly contacts the at least one electronic component.

The disclosure also provides an embedded component substrate. The embedded component substrate includes a substrate having a first surface, a second surface, and at least one through hole penetrating through the substrate. The embedded component substrate also includes at least one electronic component formed in the at least one through hole. The embedded component substrate also includes a first wiring layer formed in the space between the at least one electronic component and the at least one through hole. The first wiring layer extends from the first surface of the substrate to the second surface along a sidewall of the at least one through hole, and directly contacts the at least one electronic component.

The disclosure also provides a method for fabricating an embedded component substrate, comprising: providing a substrate having a first surface and a second surface; forming at least one cavity in the substrate; forming at least one electronic component in the at least one cavity; and forming a first wiring layer in the space between a sidewall of the at least one electronic component and a sidewall of the at least one cavity, wherein the first wiring layer extends from the first surface of the substrate to the sidewall of the at least one cavity, and the first wiring layer directly contacts the at least one electronic component.

The disclosure also provides a method for fabricating the embedded component substrate, comprising: providing a substrate having a first surface and a second surface; forming at least one through hole in the substrate; forming at least one electronic component in the at least one through hole; and forming a first wiring layer in the space between the at least one electronic component and the at least one through hole, wherein the first wiring layer extends from the first surface of the substrate to the second surface along a sidewall of the at least one through hole, and the first wiring layer directly contacts the at least one electronic component.

A detailed description is given in the following embodiments with reference to the accompanying drawings.

BRIEF DESCRIPTION OF THE DRAWING

For a more complete understanding of the present disclosure, and the advantages thereof, reference is now made to the following descriptions taken in conjunction with the accompanying drawings, in which.

DETAILED DESCRIPTION

Figure 1A:
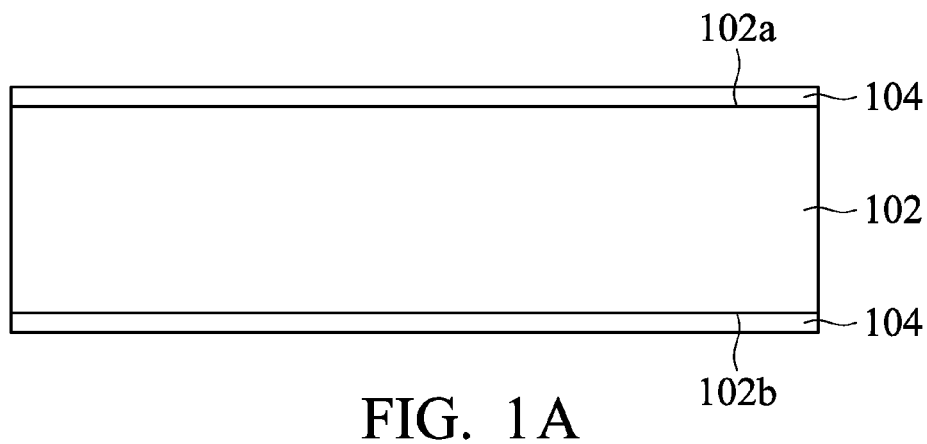
FIGS. 1A-1L show cross-sectional views of various stages of forming an embedded component substrate, in accordance with a first embodiment of the disclosure.

The present disclosure is best understood from the following detailed description when read with the accompanying figures. This description is made for the purpose of illustrating the general principles of the disclosure and should not be taken in a limiting sense. The present disclosure may repeat reference numerals and/or letters in the various examples. This repetition is for the purpose of simplicity and clarity and does not in itself dictate a relationship between the various embodiments and/or configurations discussed. In addition, the formation of a first feature over or on a second feature in the description that follows may include embodiments in which the first and second features are formed in direct contact, and may also include embodiments in which additional features may be formed between the first and second features such that the first and second features may not be in direct contact.

The disclosure provides an embedded component substrate and a method for fabricating the same. FIGS. 1A-1L show cross-sectional views of various stages of forming an embedded component substrate, in accordance with a first embodiment of the disclosure. Referring to FIG. 1A, a substrate 102 is firstly provided. The core material of the substrate 102 may include paper phenolic resin, composite epoxy resin, polyimide resin, glass fiber, or a substrate impregnated by the above material. The substrate 102 includes a first surface 102a and a second surface 102b, the first surface 102a and the second surface 102b respectively have a copper layer 104 formed thereon. The copper layer 104 is formed on the substrate 102 by an electroplating process, a laminating process, or a coating process, and followed by an image transferring process which includes a photoresist coating step, an exposing step, a developing step, an etching step, and a stripping step.

Figure 1B:
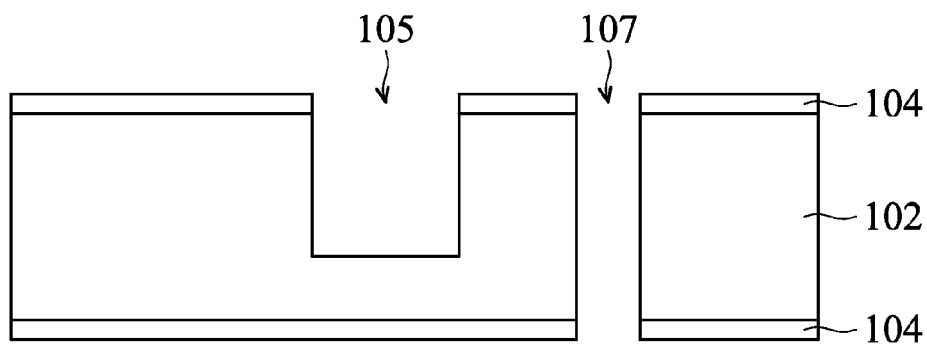

Referring to FIG. 1B, a cavity 105 and a through hole 107 are formed in the substrate 102. The cavity 105 is configured to embed a subsequently formed electronic component 10 (referring to FIG. 1D) therein to significantly reduce the overall volume of the package structure. In some embodiments, the method for forming the cavity 105 may include a physical metallic mechanical fabricating process or a chemical etching process. The size of the cavity 105 may be adjusted according to the size of the electronic component 10 according to actual applications. In general, the size of the cavity 105 may be lightly larger than the size of the electronic component 10 in order to fix and align the electronic component 10 more easily.

Referring to FIG. 1B again, the through hole 107 passes through the substrate 102. The through hole 107 is configured to form a conductive path between the top surface and the bottom surface of the substrate 102 in order to facilitate the formation of the following double side build-up wiring layers. In some embodiments, the through hole 107 is formed by a numerical control drilling process or another drilling process.

Figure 1C:
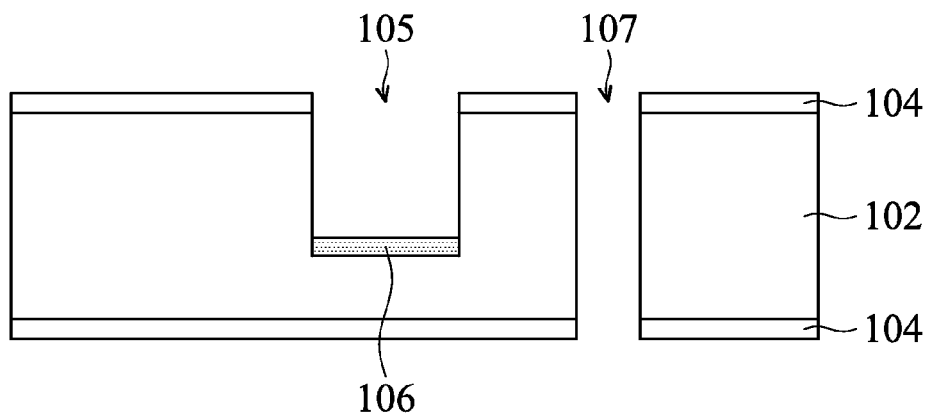

Referring to FIG. 1C, an adhesion layer 106 is formed in the bottom of the cavity 105. The adhesion layer 106 is configured to fix the subsequently formed electronic component 10.

Figure 1D:
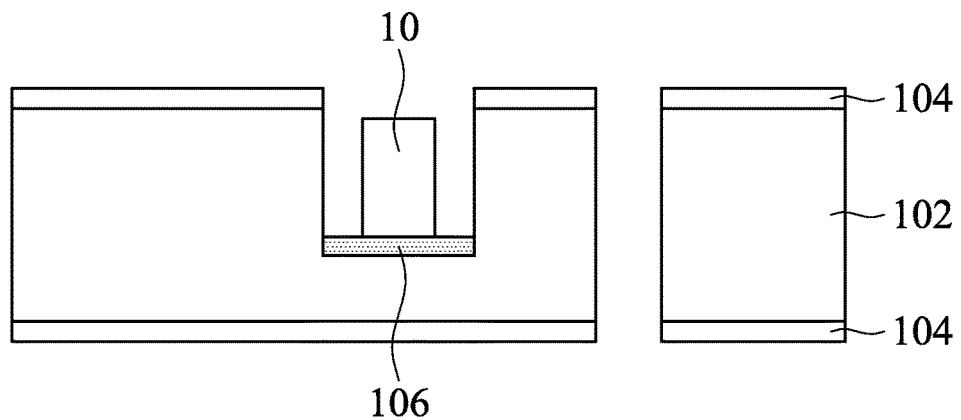
Figure 1D:
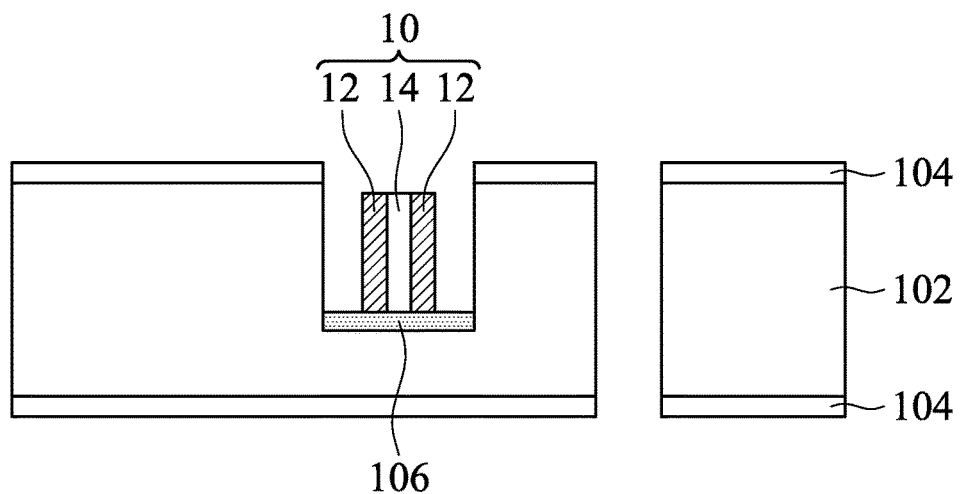

Referring to FIG. 1D, the electronic component 10 is formed in the cavity 105. More specifically, the electronic component 10 is formed on the adhesion layer 106. The electronic component 10 may include an active component or a passive component. For example, the active component may be chip. For example, the passive component may be a resistor, a capacitor, an inductor and/or a fuse.

In some embodiments, referring to FIG. 1D', the electronic component 10 is a capacitor. The capacitor has a metal feature 12 and an insulating feature 14, and the metal feature 12 is on the two opposite sides of the insulating feature 14.

Figure 1E:
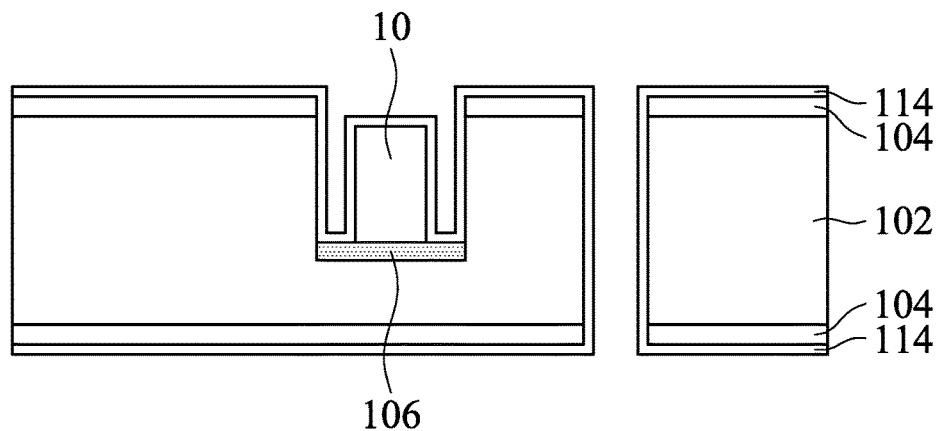

Referring to FIG. 1E, a chemical plating metal layer 114 is formed on the first surface 102a and the second surface 102b of the substrate 102, on the bottom and the sidewalls of the cavity 105, and on the top surface and the sidewalls of the electronic component 10.

It should be noted that the chemical plating metal layer 114 is used as a seed layer for a subsequently formed electroplating metal layer 124 to facilitate the formation of the electroplating metal layer 124 (referring to FIG. 1E). In some embodiments, the chemical plating metal layer 114 may include copper (Cu), aluminum (Al), nickel (Ni), gold (Au), palladium (Pd), or combinations thereof.

Figure 1F:
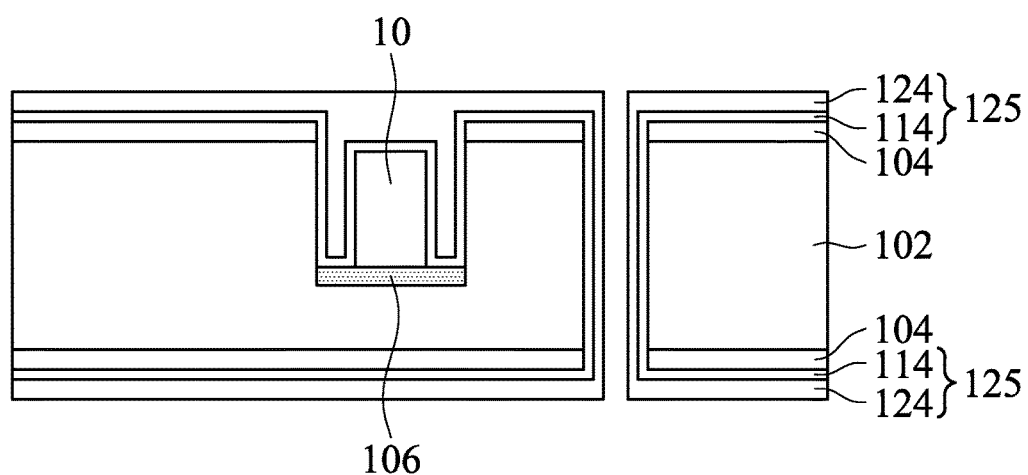

Referring to FIG. 1F, the electroplating metal layer 124 is conformally formed on the chemical plating metal layer 114. The chemical plating metal layer 114 and the electroplating metal layer 124 may be collectively designated as a conductive layer 125. In some embodiments, the electroplating metal layer 124 may include copper, aluminum, nickel, gold, palladium, or combinations thereof. In some embodiments, the chemical plating metal layer 114 is made of copper, and the electroplating metal layer 124 is also made of copper.

It should be noted that the space between a sidewall of the cavity 105 and a sidewall of the electronic component 10 is filled with the electroplating metal layer 124. In some embodiments, compared with the space between a sidewall of the cavity 105 and a sidewall of the electronic component 10, the through hole 107 has a larger hole diameter and therefore the electroplating metal layer 124 cannot completely fill the through hole 107.

Figure 1G:
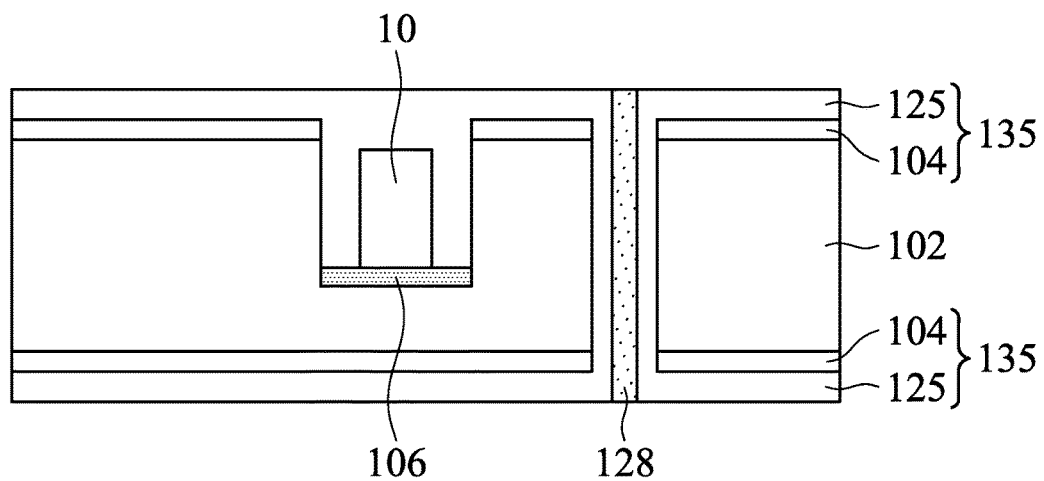

Referring to FIG. 1G, the through hole 107 is filled with an ink 128 by a hole filling step. In some embodiments, the ink 128 may be, for example, resin ink. The ink 128 is cured in a baking step. In addition, some ink 128 remains outside of the through hole 107 during the hole filling step, and therefore a planarizing step is needed to remove the remaining ink 128. The planarizing step may be, for example, a mechanical polishing step.

Figure 1H:
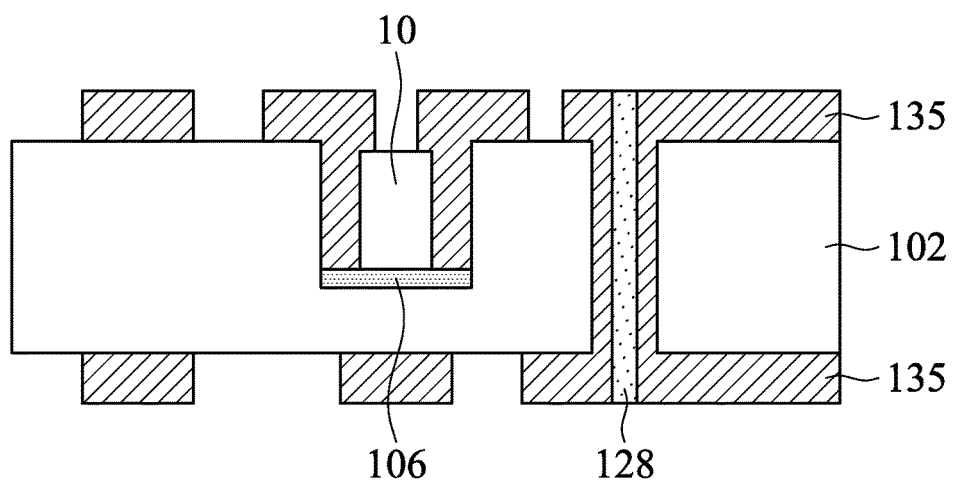
Figure 1:
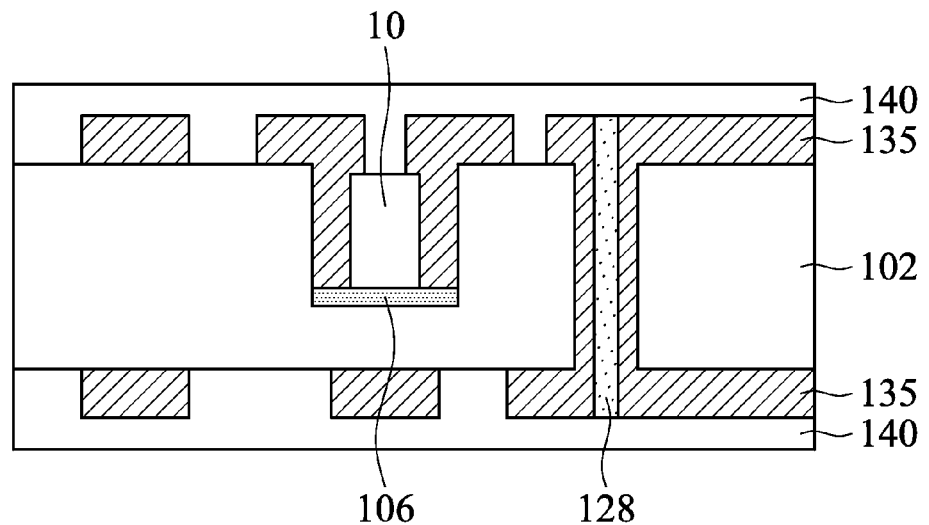
Figure 1:
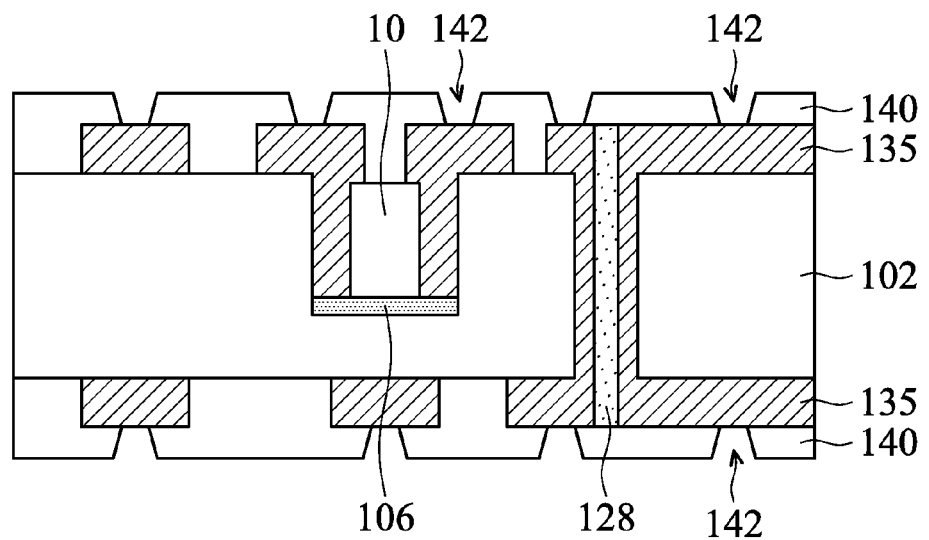

Referring to FIG. 1H, a first wiring layer 135 is formed on the first surface 102a and the second surface 102b of the substrate 102 by a patterning process, and the first wiring layer 135 directly contacts the electronic components 10. In some embodiments, when the electronic component 10 is a capacitor, the first wiring layer 135 directly contacts the metal feature 12 on the two opposite sides of the capacitor (referring to FIG. 1D').

Since the copper layer 104 formed on the substrate 102 is conductive, the copper layer 104 and the conductive layer 125 are drawn as a single layer for the purpose of simplicity and clarity in this disclosure. The patterning process may be the so-called "DES method" which includes the following steps: exposing step, developing step, etching step, and stripping step.

Referring to FIG. 1I, after the patterning process, an insulating layer 140 is formed on the first wiring layer 135. The insulating layer 140 may be polymer materials, such as epoxy resin, polyimide, cyanate ester, bismaleimide triazine, or combinations thereof; and the insulating layer 140 may also be polymer composite materials, such as a polymer material blended with glass fiber, clay, or ceramic.

Next, referring to FIG. 1J, a plurality of blind holes 142 are formed in the insulating layer 140 to expose the first wiring layer 135. In some embodiments, the blind holes 142 are formed by a laser drilling method.

Figure 1K:
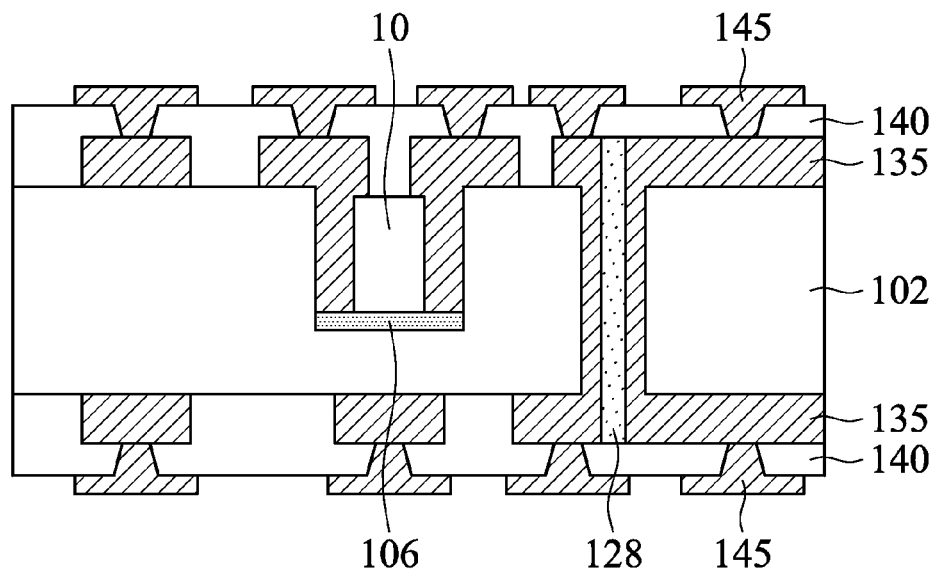

Referring to FIG. 1K, a second wiring layer 145 is formed in the blind holes 142 such that the first wiring layer 135 is electrically connected to the second wiring layer 145.

Figure 1L:
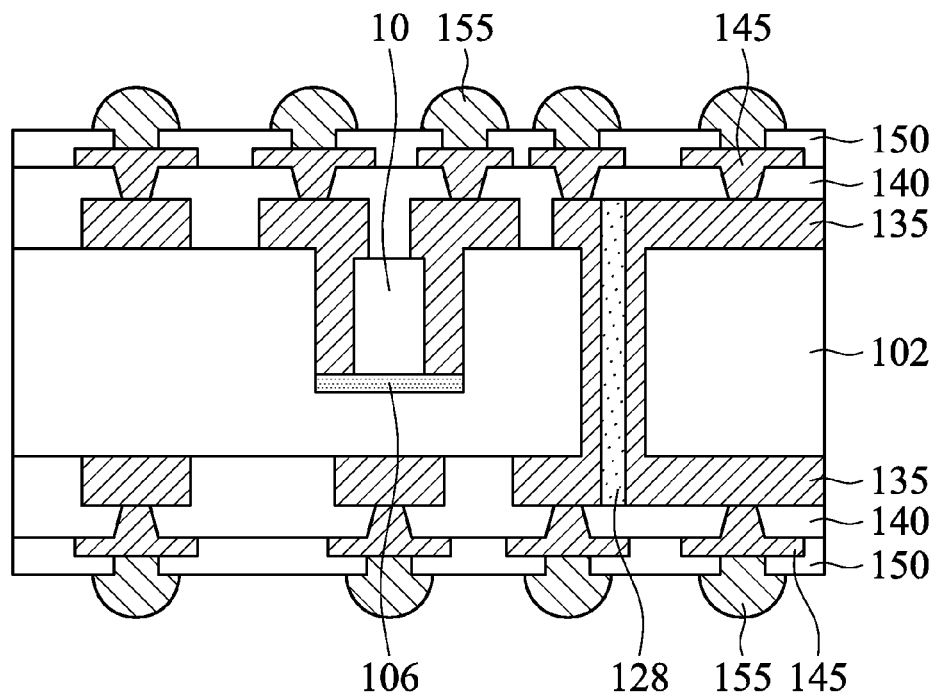

Referring to FIG. 1L, a protection layer 150 is formed on the second wiring layer 145 and the insulating layer 140. The protection layer 150 is configured to protect the buried wiring layers from oxidization. In some embodiments, the protection layer 150 is made of a solder resist material, such as solder mask. Afterwards, a plurality of solder balls 155 are formed by a ball implantation process such that the signal of the electronic component 10 can be transmitted to an external device.

It should be noted that the sidewalls of the electronic component 10 are surrounded by the first wiring layer 135 such that the signal of electronic component 10 can be transmitted to the external device. In addition, by the design of the first wiring layer 135, the contact area between the electronic component 10 and the first wiring layer 135 may be increased and the design flexibility of the wiring layer may be improved.

In some embodiments, when the electronic component is a capacitor, the metal feature 12 on the two opposite sides of the capacitor may directly contact the first wiring layer 135 to increase the contact area such that the design flexibility of the wiring layer may be improved.

FIGS. 2A-2I show cross-sectional views of various stages of forming an embedded component substrate, in accordance with a second embodiment of the disclosure. The same reference numerals in FIGS. 2A-2I and FIGS. 1A-1L will be used to designate the same elements.

Figure 2A:
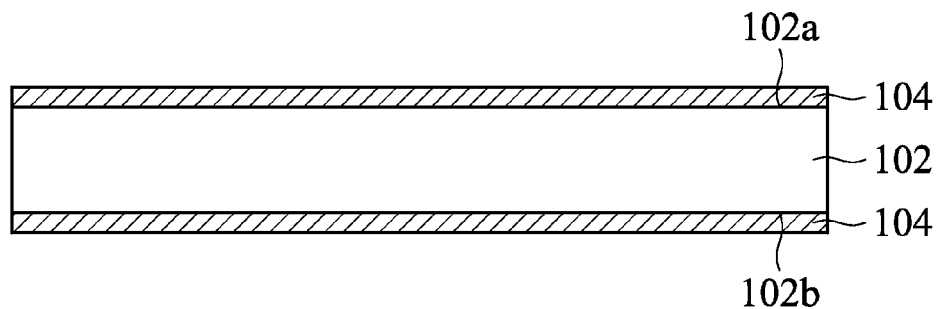
FIGS. 2A-2I show cross-sectional views of various stages of forming an embedded component substrate, in accordance with a second embodiment of the disclosure.

Referring to FIG. 2A, the substrate 102 has the first surface 102a and the second surface 102b, and the first surface 102a and the second surface 102b respectively have the copper layer 104 formed thereon.

Figure 2B:
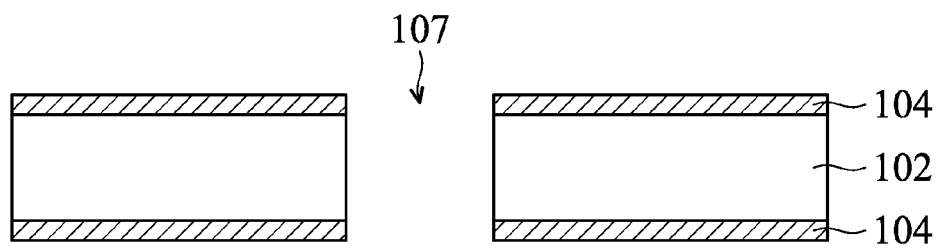

Referring to FIG. 2B, the through hole 107 is formed in the substrate 102. The through hole 107 is configured to embed the subsequently formed electronic component 10 (referring to FIG. 2C) therein to significantly reduce the overall volume of the package structure.

Figure 2C:
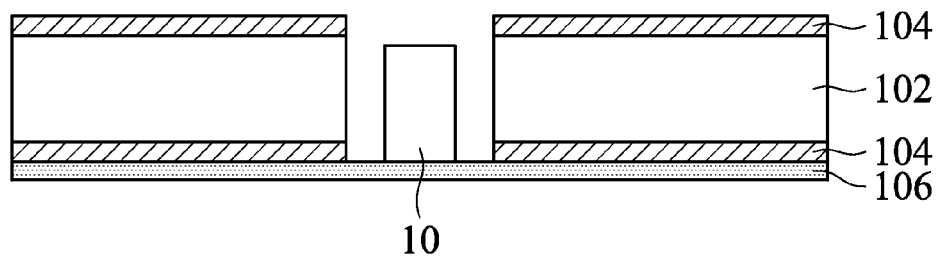

Referring to FIG. 2C, the adhesion layer 106 is formed in the bottom of the through hole 107. The adhesion layer 106 is configured to fix the subsequently formed electronic component 10. The electronic component 10 may include an active component or a passive component. For example, the active component may be a chip. For example, the passive component may be a resistor, a capacitor, an inductor and/or a fuse.

Figure 2D:
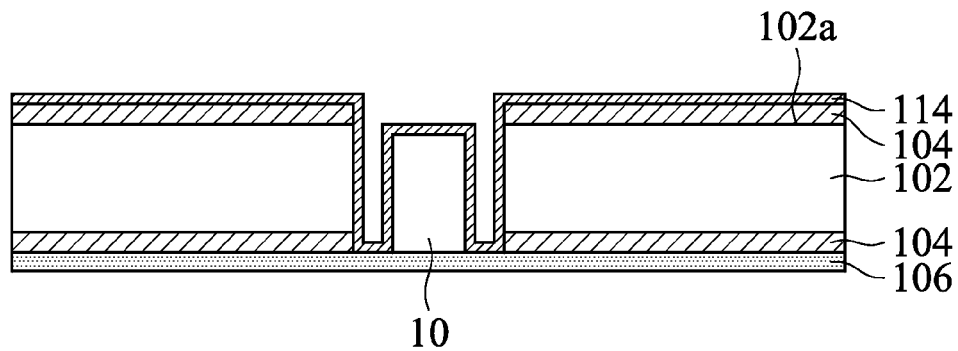

Referring to FIG. 2D, the chemical plating metal layer 114 is formed on the first surface 102a of the substrate 102, on the adhesion layer 106, and on the top surface and the sidewalls of the electronic component 10.

It should be noted that the chemical plating metal layer 114 is used as a seed layer for the subsequently formed electroplating metal layer 124 (referring to FIG. 2E) to facilitate the formation of the electroplating metal layer 124. In some embodiments, the chemical plating metal layer 114 may include copper, aluminum, nickel, gold, palladium, or combinations thereof.

Figure 2E:
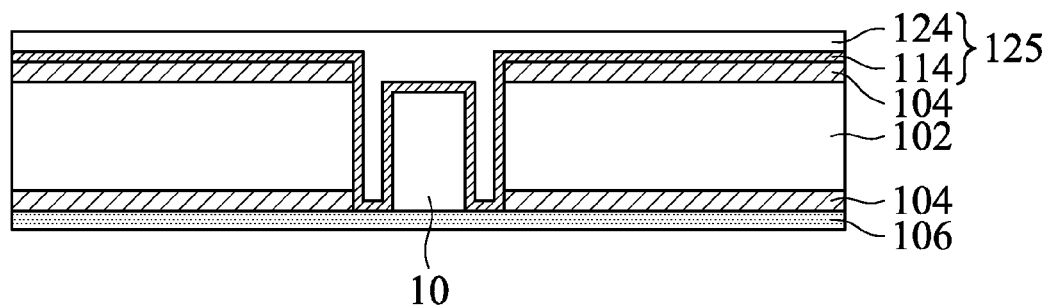

Referring to FIG. 2E, the electroplating metal layer 124 is conformally formed on the chemical plating metal layer 114, and the chemical plating metal layer 114 and the electroplating metal layer 124 may be collectively designated as the conductive layer 125. In some embodiments, the electroplating metal layer 124 may include copper, aluminum, nickel, gold, palladium, or combinations thereof. In some embodiments, the chemical plating metal layer 114 is made of copper, and the electroplating metal layer 124 is also made of copper.

Figure 2F:
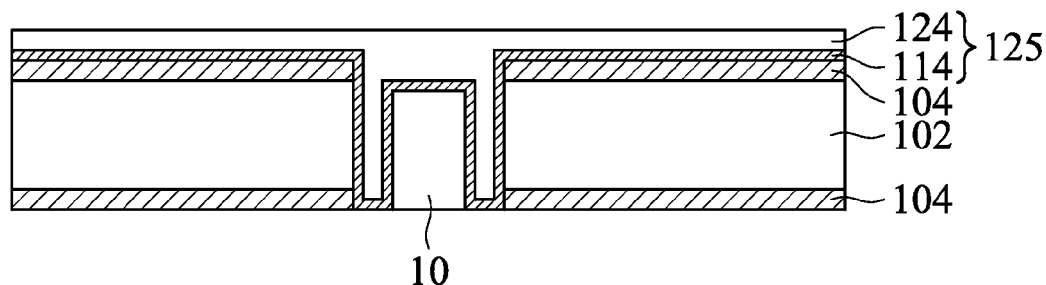

Referring to FIG. 2F, the adhesion layer 106 is removed to expose the bottom of the electronic component 10 and the copper layer 104 on the second surface 102b.

Figure 2G:
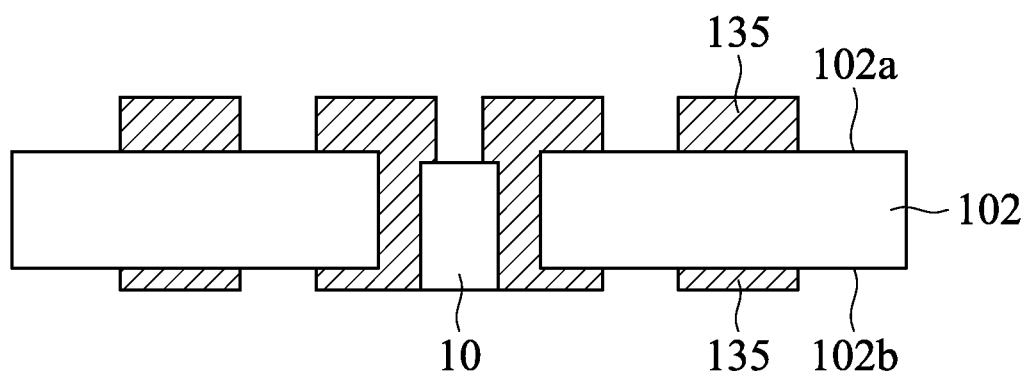

Referring to FIG. 2G, the first wiring layer 135 is formed on the first surface 102a and the second surface 102b of the substrate 102 by a patterning process. Since the copper layer 104 formed on the substrate 102 is conductive, the copper layer 104 and the conductive layer 125 are drawn as a single layer for the purpose of simplicity and clarity in this disclosure. It should be noted that the first wiring layer 135 extends from the first surface 102a of the substrate 102 to the second surface 102b along the sidewall of the through hole 107, and the first wiring layer 135 directly contacts the electronic component 10.

Figure 2H:
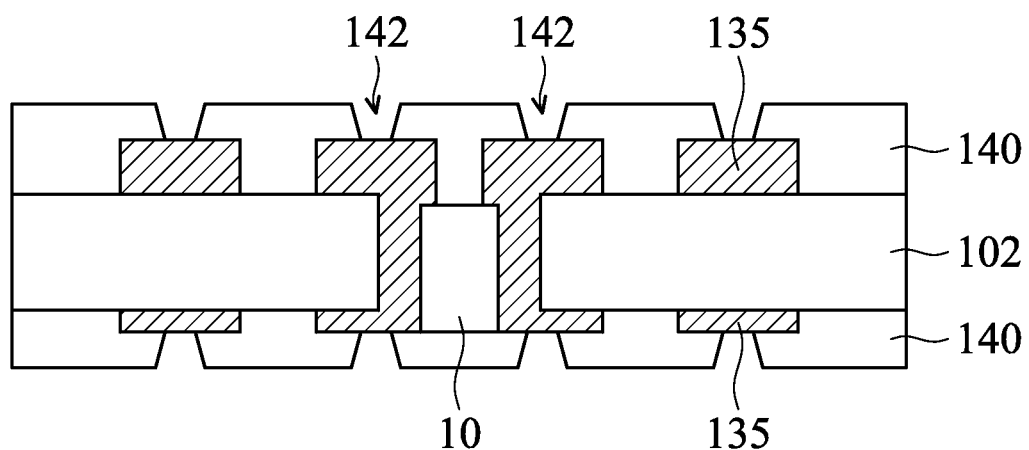
Figure 2:
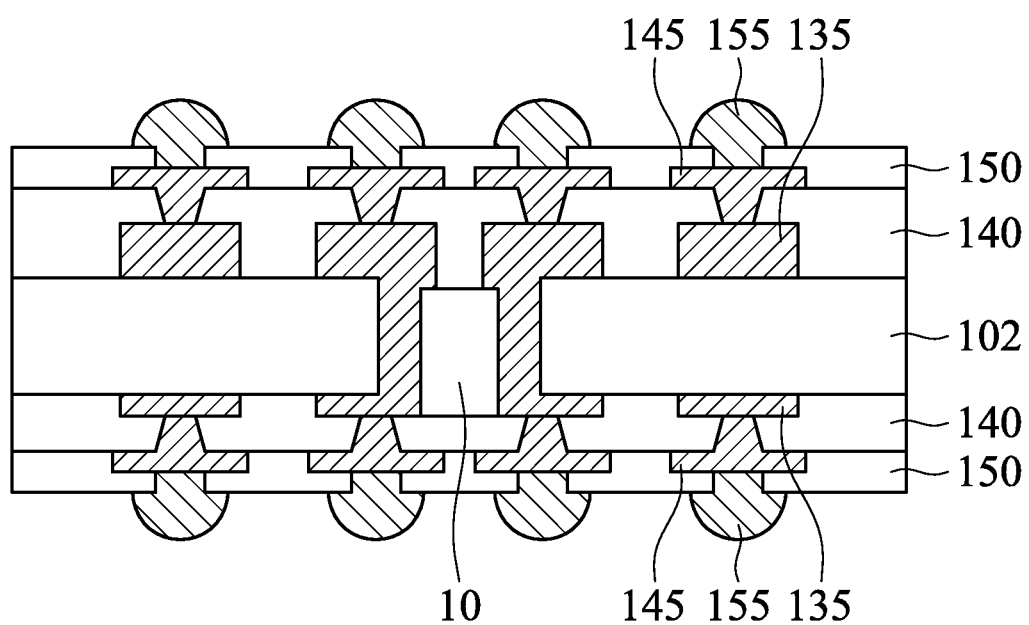

Referring to FIG. 2H, after the patterning process, the insulating layer 140 is formed on the first wiring layer 135. Then, a plurality of blind holes 142 are formed in the insulating layer 140 to expose the first wiring layer 135. In some embodiments, the blind holes 142 are formed by a laser drilling method.

Referring to FIG. 2I, the second wiring layer 145 is formed in the blind holes 142 such that the first wiring layer 135 is electrically connected to the second wiring layer 145. Then, the protection layer 150 is formed on the second wiring layer 145 and the insulating layer 140. The protection layer 150 is configured to protect the buried wiring layers from oxidization. In some embodiments, the protection layer 150 is made of a solder resist material, such as solder mask. Afterwards, a plurality of solder balls 155 are formed by a ball implantation process such that the signal of the electronic component 10 can be transmitted to an external device.

In the second embodiment, the electronic component 10 is formed in the through hole 107. Therefore, a double side electrical connection is achieved by transmitting the signal of the electronic component 10 to the two opposite sides of the substrate 102 through the first wiring layer 135 and the second wiring layer 145.

FIGS. 3A-3H show cross-sectional views of various stages of forming an embedded component substrate, in accordance with a second embodiment of the disclosure. The same reference numerals in FIGS. 3A-3H and FIGS. 2A-2I will be used to designate the same elements.

Figure 3A:
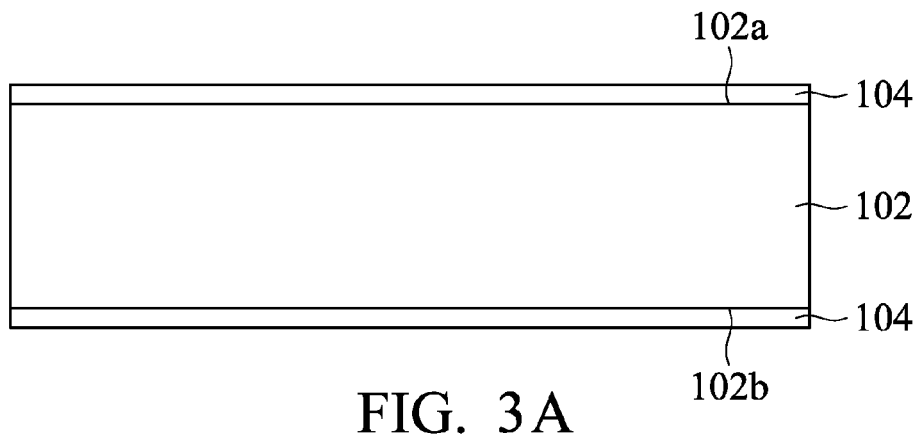
FIGS. 3A-3H show cross-sectional views of various stages of forming an embedded component substrate, in accordance with a third embodiment of the disclosure.

Referring to FIG. 3A, the substrate 102 is provided. The substrate 102 includes the first surface 102a and the second surface 102b, and the first surface 102a and the second surface 102b respectively have the copper layer 104 formed thereon.

Figure 3B:
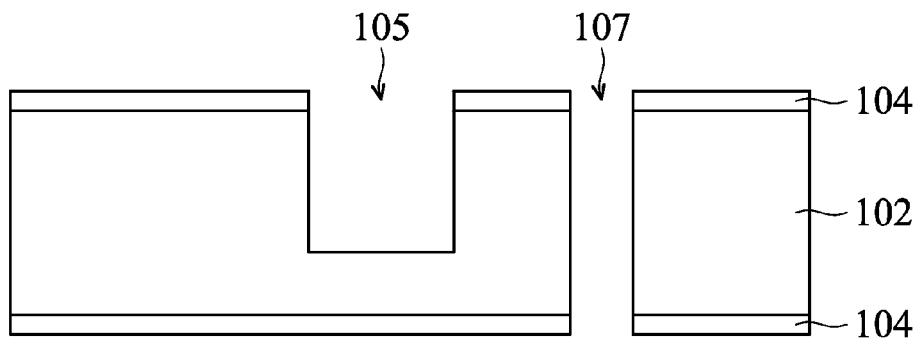

Referring to FIG. 3B, the cavity 105 and the through hole 107 are formed in the substrate 102. The cavity 105 is configured to embed the subsequently formed electronic component 10 (referring to FIG. 3D) therein to significantly reduce the overall volume of the package structure.

Referring to FIG. 3B again, the through hole 107 passes through the substrate 102. The through hole 107 is configured to form a conductive path between the top surface and the bottom surface of the substrate 102 in order to facilitate the formation of the following double side build-up wiring layers.

Figure 3C:
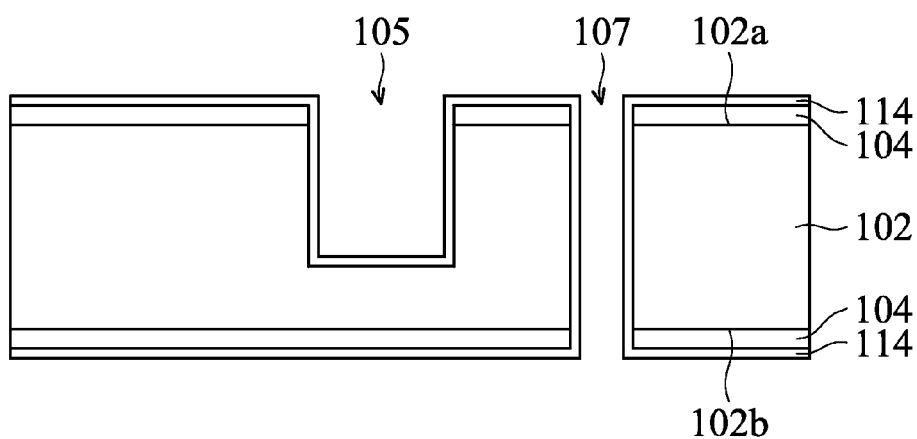

Referring to FIG. 3C, the chemical plating metal layer 114 is formed on the first surface 102a and the second surface 102b of the substrate 102, on the bottom and the sidewalls of the cavity 105, and on the sidewalls of the through hole 107.

Figure 3D:
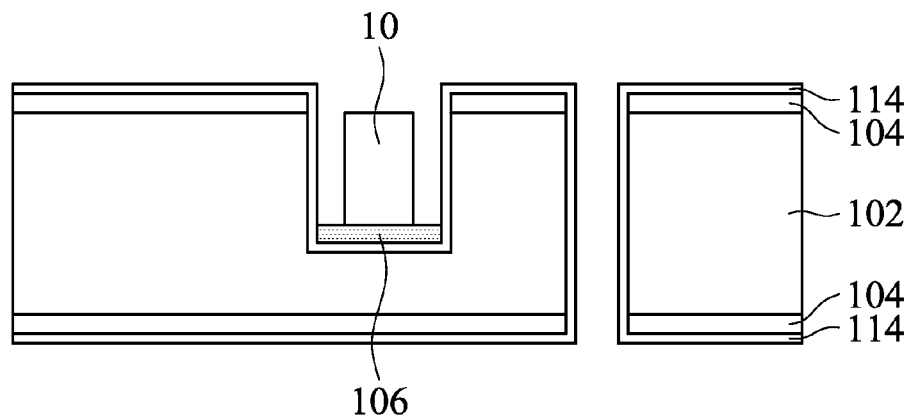

Referring to FIG. 3D, the adhesion layer 106 is formed on the bottom of the cavity 105. Then, the electronic component 10 is formed on the adhesion layer 106. The adhesion layer 106 is configured to fix the electronic component 10.

Figure 3E:
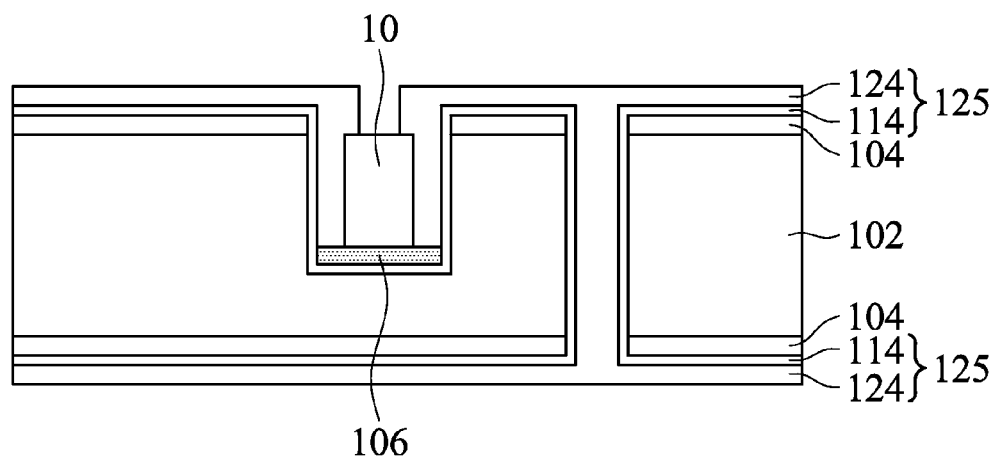

Referring to FIG. 3E, the electroplating metal layer 124 is conformally formed on the chemical plating metal layer 114, and the chemical plating metal layer 114 and the electroplating metal layer 124 may be collectively designated as the conductive layer 125. In some embodiments, the chemical plating metal layer 114 is made of copper, and the electroplating metal layer 124 is also made of copper.

It should be noted that in the first embodiment, the adhesion layer 106 is formed before the formation of the chemical plating metal layer 114. In the third embodiment, the adhesion layer 106 is formed after the formation of the chemical plating metal layer 114, and therefore no chemical plating metal layer 114 is formed on the top surface of the electronic component 10, and therefore no electroplating metal layer 124 will be formed on the top surface of the electronic component 10 during the subsequent electroplating process. As a result, when the electronic component 10 is a capacitor, the insulating feature 14 (referring to FIG. 1D') formed on the middle of the capacitor is not connected with the metal feature 12 on the two opposite sides. Therefore, compared with the first embodiment, the third embodiment can omit additional steps for removing the conductive layer 125 on the insulating feature 14.

Furthermore, the through hole 107 is completely filled with the electroplating metal layer 124 in the third embodiment. Therefore, compared with the first embodiment, the third embodiment can omit the filling materials and steps for filling the through hole 107.

Figure 3F:
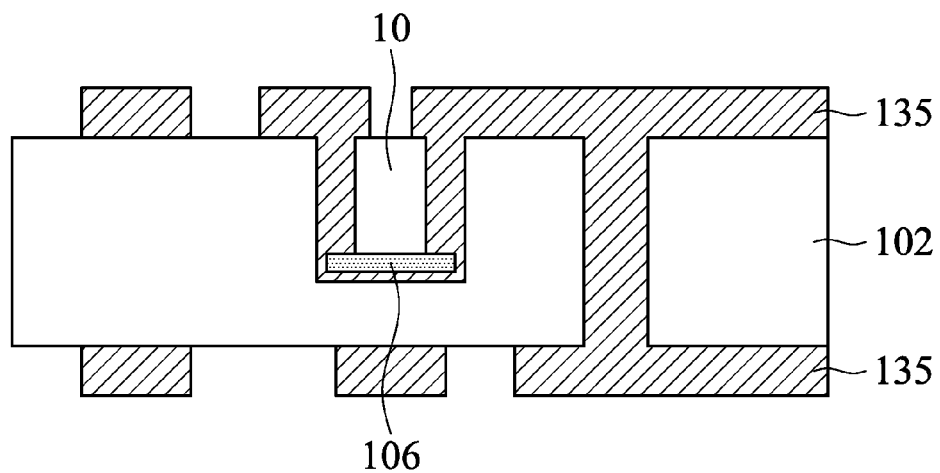

Referring to FIG. 3F, the first wiring layer 135 is formed on the first surface 102a and the second surface 102b of the substrate 102 by a patterning process. Since the copper layer 104 formed on the substrate 102 is conductive, the copper layer 104 and the conductive layer 125 are drawn as a single layer for the purpose of simplicity and clarity in this disclosure.

Figure 3G:
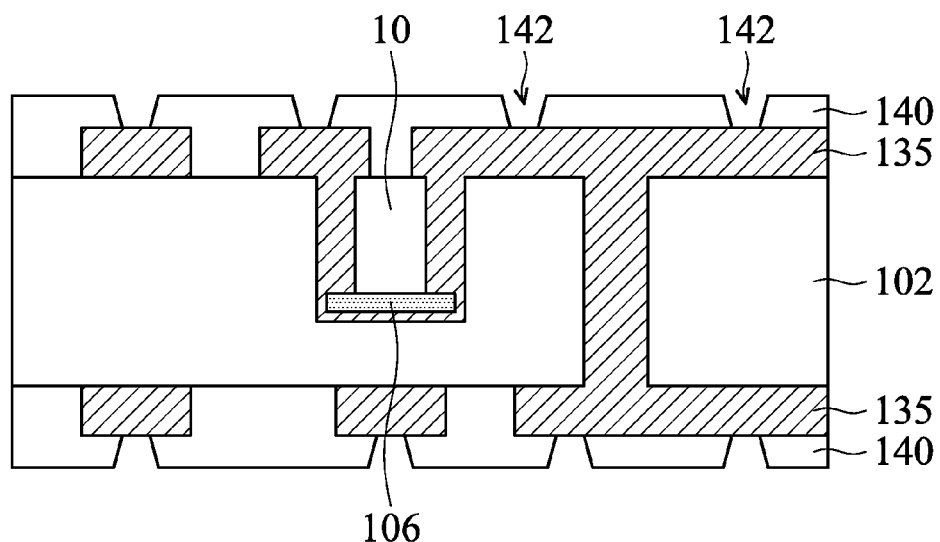

Referring to FIG. 3G, after the patterning process, the insulating layer 140 is formed on the first wiring layer 135. Then, a plurality of blind holes 142 are formed in the insulating layer 140 to expose the first wiring layer 135. In some embodiments, the blind holes 142 are formed by a laser drilling method.

Figure 3H:
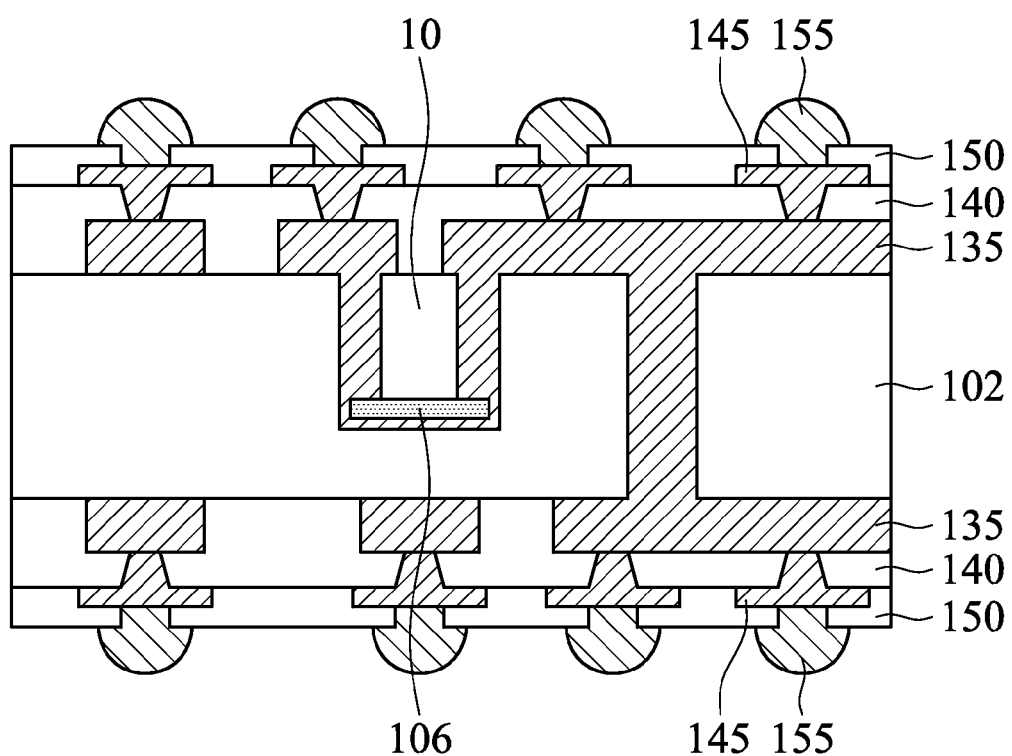

Referring to FIG. 3H, the second wiring layer 145 is formed in the blind holes 142 such that the first wiring layer 135 is electrically connected to the second wiring layer 145. Then, the protection layer 150 is formed on the second wiring layer 145 and the insulating layer 140. The protection layer 150 is configured to protect the buried wiring layers from oxidization. Afterwards, a plurality of solder balls 155 are formed by a ball implantation process such that the signal of the electronic component 10 can be transmitted to an external device.

As mentioned previously, the embedded component substrate of the disclosure has the following advantages:

(1) In the first embodiment to the third embodiment, the contact area between the first wiring layer and the electronic component is increased by the first wiring layer which extends from the top surface of the substrate to the sidewalls of the cavity. Therefore, the yield of the embedded component substrate is improved. In addition, the design flexibility of the wiring layer is also improved.

(2) In the second embodiment, by forming the electronic component in the through hole, double side electrical connection is achieved and thus the area of the wiring layer can be reduced.

(3) In the third embodiment, when the electronic component is a capacitor, no additional step for removing the conductive layer on the insulating feature of the capacitor is needed. In addition, the through hole is completely filled with the electroplating metal layer, and thus the filling materials and steps for filling the through hole can be omitted.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An embedded component substrate, comprising:
a substrate having at least one cavity, a first surface and a second surface;
at least one electronic component formed in the at least one cavity;
a first wiring layer extending from the first surface of the substrate to a sidewall and a bottom of the at least one cavity, wherein the first wiring layer directly contacts the at least one electronic component; and
an adhesion layer formed in the at least one cavity, wherein the first wiring layer directly contacts a top surface and a bottom surface of the adhesion layer.

2. The embedded component substrate as claimed in claim 1, wherein the at least one electronic component comprises an active component or a passive component.

3. The embedded component substrate as claimed in claim 1, wherein the at least one electronic component is formed on the adhesion layer.

4. The embedded component substrate as claimed in claim 3, wherein the first wiring layer comprises a portion under the adhesion layer, and the adhesion layer is formed between the at least one electronic component and the portion of the first wiring layer under the adhesion layer.

5. The embedded component substrate as claimed in claim 1, further comprising:
an insulating layer formed on the first wiring layer;
a plurality of blind holes formed in the insulating layer, wherein the first wiring layer is exposed by the plurality of blind holes; and
a second wiring layer formed in the plurality of blind holes, wherein the first wiring layer is electrically connected to the second wiring layer.

6. The embedded component substrate as claimed in claim 1, further comprising:
a plurality of through holes penetrating through the substrate.

7. The embedded component substrate as claimed in claim 6, wherein the first wiring layer extends from the first surface of the substrate to the second surface along a sidewall of one of the plurality of through holes.

8. The embedded component substrate as claimed in claim 6, wherein the plurality of through holes are completely filled with the first wiring layer.

9. A method for fabricating an embedded component substrate, comprising:
providing a substrate having a first surface and a second surface;
forming at least one cavity in the substrate;
forming an adhesion layer in the at least one cavity;
forming at least one electronic component in the at least one cavity; and
forming a first wiring layer, wherein the first wiring layer extends from the first surface of the substrate to a sidewall and a bottom of the at least one cavity, and the first wiring layer directly contacts the at least one electronic component and a top surface and a bottom surface of the adhesion layer.

10. The method for fabricating the embedded component substrate as claimed in claim 9, wherein the at least one electronic component is formed on the adhesion layer.

11. The method for fabricating the embedded component substrate as claimed in claim 9, wherein forming the first wiring layer comprises:
forming a chemical plating metal layer extending from the first surface of the substrate to the sidewall and the bottom of the at least one cavity, wherein the adhesion layer is formed on the chemical plating metal layer, and the at least one electronic component is formed on the adhesion layer.

12. The method for fabricating the embedded component substrate as claimed in claim 11, wherein forming the first wiring layer further comprises:

forming an electroplating metal layer on the chemical plating metal layer, wherein the chemical plating metal layer and the electroplating metal layer form a conductive layer.

13. The method for fabricating the embedded component substrate as claimed in claim 9, further comprising:
  forming an insulating layer on the first wiring layer;
  forming a plurality of blind holes in the insulating layer, wherein the first wiring layer is exposed by the plurality of blind holes; and
  forming a second wiring layer in the plurality of blind holes, wherein the first wiring layer is electrically connected to the second wiring layer.

14. The method for fabricating the embedded component substrate as claimed in claim 12, wherein forming the first wiring layer further comprises:
  patterning the conductive layer.

* * * * *

UNITED STATES PATENT AND TRADEMARK OFFICE
CERTIFICATE OF CORRECTION

| | | |
|---|---|---|
| PATENT NO. | : 9,894,779 B2 | Page 1 of 1 |
| APPLICATION NO. | : 14/790669 | |
| DATED | : February 13, 2018 | |
| INVENTOR(S) | : Wei-Ta Fu, Kuo-Chang Wu and Yu-Chih Lin | |

It is certified that error appears in the above-identified patent and that said Letters Patent is hereby corrected as shown below:

On the Title Page

Item (73) should be corrected to read:
--Assignees: NAN YA PCB CORPORATION, Taoyuan City (TW)--

Signed and Sealed this
Tenth Day of April, 2018

Andrei Iancu
*Director of the United States Patent and Trademark Office*